United States Patent
Chung

(10) Patent No.: US 9,877,365 B1
(45) Date of Patent: Jan. 23, 2018

(54) LIGHT-EMITTING DEVICE FOR PROVIDING FLASH LIGHT SOURCE

(71) Applicant: PARAGON SEMICONDUCTOR LIGHTING TECHNOLOGY CO., LTD., New Taipei (TW)

(72) Inventor: Chia-Tin Chung, Miaoli County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/429,148

(22) Filed: Feb. 9, 2017

(30) Foreign Application Priority Data

Dec. 5, 2016 (TW) .............................. 105218547 U

(51) Int. Cl.
*H01Q 1/26* (2006.01)
*H05B 33/08* (2006.01)
*H01L 25/075* (2006.01)
*H01L 33/56* (2010.01)
*H01L 33/46* (2010.01)
*H05B 37/02* (2006.01)
*H01Q 1/44* (2006.01)
*H01Q 1/22* (2006.01)

(52) U.S. Cl.
CPC ..... *H05B 33/0815* (2013.01); *H01L 25/0753* (2013.01); *H01L 33/46* (2013.01); *H01L 33/56* (2013.01); *H01Q 1/2283* (2013.01); *H01Q 1/44* (2013.01); *H05B 33/0848* (2013.01); *H05B 37/0272* (2013.01); *H05B 33/0854* (2013.01); *H05B 37/0218* (2013.01)

(58) Field of Classification Search
CPC ............ H05B 37/0272; H05B 37/0218; H05B 33/0854
USPC ................................... 315/149, 150, 34, 362
See application file for complete search history.

(56) References Cited

U.S. PATENT DOCUMENTS

| | | | | |
|---|---|---|---|---|
| 8,264,155 B2* | 9/2012 | Negley | .............. | H05B 33/0884 315/129 |
| 8,643,293 B2* | 2/2014 | Tseng | ................. | H05B 37/0227 315/200 A |
| 8,994,294 B2* | 3/2015 | Sawada | .............. | H05B 33/0833 315/187 |
| 9,113,528 B2* | 8/2015 | Bora | ................... | H05B 33/0863 |

* cited by examiner

*Primary Examiner* — Thuy Vinh Tran
(74) *Attorney, Agent, or Firm* — Li & Cai Intellectual Property (USA) Office

(57) ABSTRACT

The prevent invention provides a light-emitting device for providing a flash light source comprising a light-emitting module and a control module. The light-emitting module comprises a circuit substrate and a plurality of light-emitting elements disposed on the circuit substrate and electrically connected to the circuit substrate. The control module comprises a semiconductor switch element having a MOSFET for turning the light-emitting elements on or off, wherein the semiconductor switch element is electrically connected to the light-emitting elements thereby the light-emitting elements can flash via the semiconductor switch element alternately turning on and off the light-emitting elements.

9 Claims, 7 Drawing Sheets

LIGHT-EMITTING DEVICE FOR PROVIDING FLASH LIGHT SOURCE

BACKGROUND OF THE INVENTION

1. Field of the Invention

The present disclosure relates to a light-emitting device, and more particularly to a light-emitting device for providing a flash light source.

2. Description of Related Art

Comparing light emitting diodes (LEDs) with traditional light sources, light emitting diodes have the advantages of a smaller size, better power saving, better light-emitting efficiency, a longer service life, a faster transient response, and causing no heat radiation or pollution from toxic substances such as mercury. In recent years, light emitting diodes are widely used in many applications. Due to insufficient brightness, light emitting diodes were unable to replace traditional light sources before. However, through continuous upgrade of relevant technology, light-emitting diodes with high luminance and high power that are sufficient to replace traditional light sources have been developed. Nevertheless, conventional light emitting devices all use mechanical switches to control the light emitting device and to provide a flash light, thus still leaving room in the art for improvement.

SUMMARY OF THE INVENTION

One aspect of the present disclosure relates to a light-emitting device for providing a flash light source.

One of the embodiments of the present disclosure provides a light-emitting device for providing a flash light source comprising a light-emitting module, a control module and a radio receiving module. The light-emitting module includes a circuit substrate and a plurality of light-emitting elements disposed on the circuit substrate and electrically connected to the circuit substrate. The control module includes a semiconductor switch element having a MOSFET for turning the light-emitting module on or off, wherein the semiconductor switch element is electrically connected to the light-emitting elements, and each light-emitting element is alternately turned on and off by the semiconductor switch element so that the light-emitting elements can flash. The radio receiving module electrically connects to the control module, wherein the radio receiving module includes a magnetic antenna structure, a radio wave generated by a radio station is received by the magnetic antenna structure of the radio receiving module, and the radio wave has a time correction signal, wherein the time correction signal received by the radio receiving module is transmitted to the control module, the time correction signal is transformed into a time synchronization signal through the control module, and the light-emitting elements are synchronously flashed by the semiconductor switch element of the control module according to the time synchronization signal.

Another one of the embodiments of the present disclosure provides a light-emitting device for providing a flash light source comprising a light-emitting module and a control module. The light-emitting module includes a circuit substrate and a plurality of light-emitting elements disposed on the circuit substrate and electrically connected to the circuit substrate. The control module includes a semiconductor switch element having a MOSFET for turning the light-emitting module on or off, wherein the semiconductor switch element is electrically connected to the light-emitting elements, and each light-emitting element is alternately turned on and off by the semiconductor switch element so that the light-emitting elements can flash.

Yet another one of the embodiments of the present disclosure provides a light-emitting device for providing a flash light source comprising a light-emitting module, a control module and an optical sensor module. The light-emitting module includes a circuit substrate and a plurality of light-emitting elements disposed on the circuit substrate and electrically connected to the circuit substrate. The control module includes a semiconductor switch element having a MOSFET for turning the light-emitting module on or off, wherein the semiconductor switch element is electrically connected to the light-emitting elements, and each light-emitting element is alternately turned on and off by the semiconductor switch element so that the light-emitting elements can flash. The optical sensor module electrically connects to the control module for receiving an external light source, wherein the optical sensor module provides a light intensity signal to the control module according to a light intensity provided by the external light source, and the light-emitting elements are turned on to continuously flash or turned off to stop flashing by the semiconductor switch element of the control module according to the light intensity signal.

One of beneficial features of the present disclosure is that the light-emitting device for providing a flash light source of the present disclosure can control a plurality of light-emitting elements to flash through multiple features including a control module comprising a semiconductor switch element which uses a metal-oxide-semiconductor field effect transistor to turn on/off the light-emitting elements, and the semiconductor switch element which electrically connects to the light-emitting elements alternately turning on/off the light-emitting elements.

Another one of beneficial features of the present disclosure is that the light-emitting device for providing a flash light source of the present disclosure has multiple features including a radio receiving module receiving a radio wave with a time correction signal from a radio station via a magnetic antenna structure, and a control module transforming the time correction signal to a time synchronization signal so that the semiconductor switch element can control a plurality of light-emitting elements to flash in a synchronized manner according to the time synchronization signal.

Still another one of beneficial features of the present disclosure is that the light-emitting device for providing a flash light source of the present disclosure has multiple features including an optical sensor module electrically connecting to a control module and the optical sensor module receiving light from an external light source, and the optical sensor module providing a light intensity signal to the control module according to a light intensity provided by the external light source so that the semiconductor switch element can turn on and control light-emitting elements to continuously flash or turn off and control the light-emitting elements to stop flashing according to the light intensity signal.

To further understand the techniques, means and effects of the present disclosure applied for achieving the prescribed objectives, the following detailed descriptions and appended drawings are hereby referred to, such that, and through which, the purposes, features and aspects of the present disclosure can be thoroughly and concretely appreciated.

However, the appended drawings are provided solely for reference and illustration, without any intention to limit the present disclosure.

DETAILED DESCRIPTION OF THE PREFERRED EMBODIMENTS

The embodiments of a light-emitting device for providing a flash light source of the present disclosure are described. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

Figure 1:
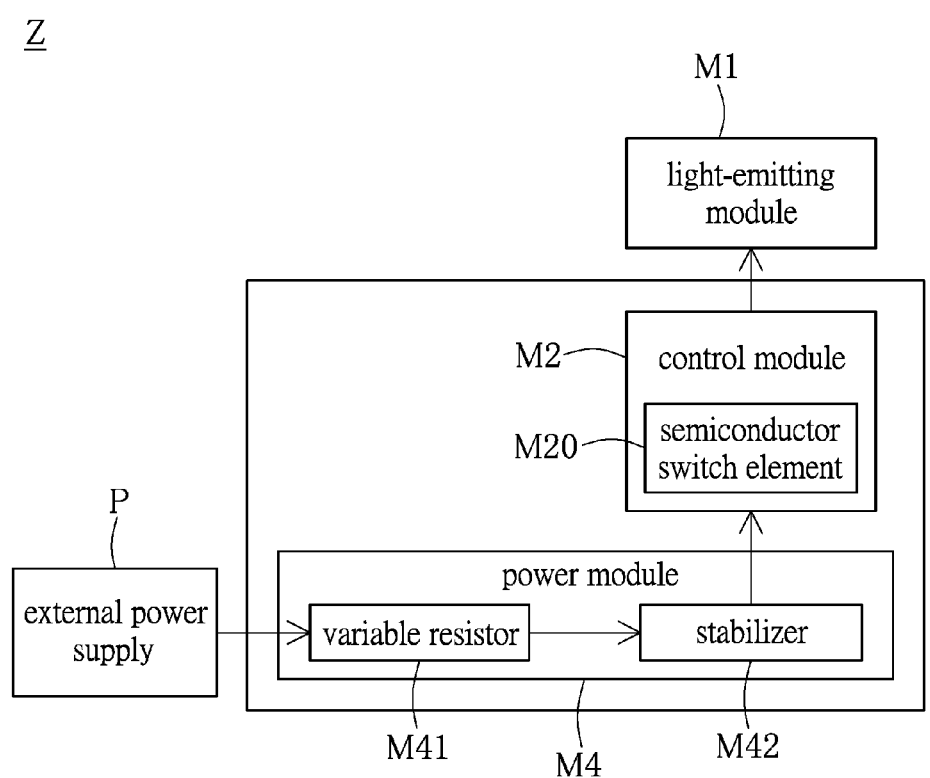
FIG. 1 shows a function block diagram of the light-emitting device for providing a flash light source according to the first embodiment of the present disclosure.

Referring to FIG. 1, a light-emitting device Z for providing a flash light source comprising a light-emitting module M1, a control module M2 and a power module M4 is provided according the first embodiment of the present disclosure.

Figure 2:
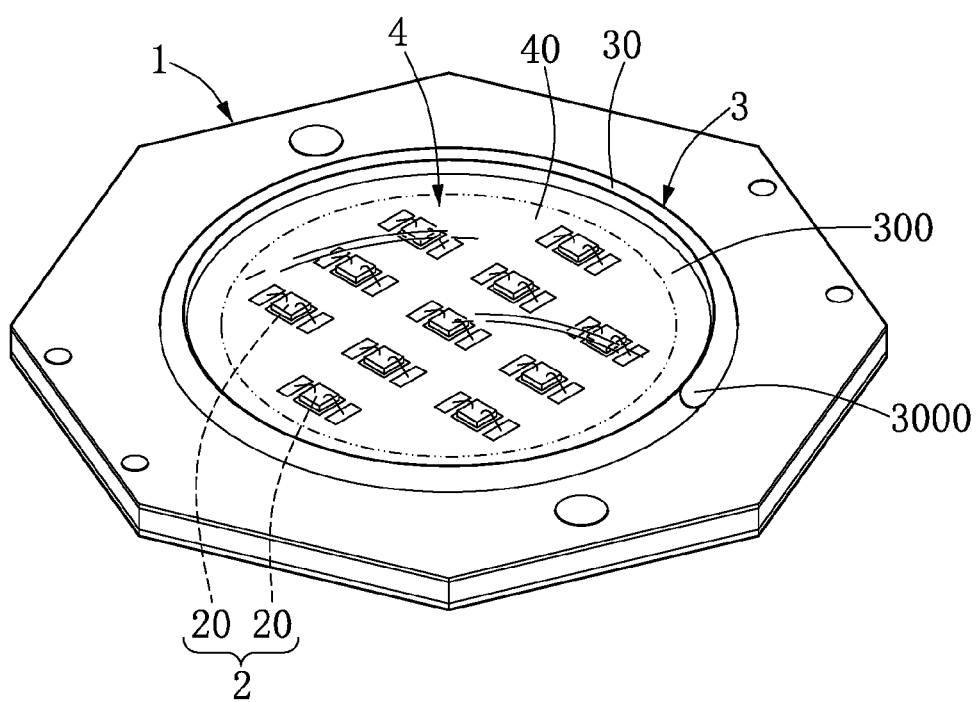
FIG. 2 shows a schematic perspective view of one of light-emitting modules of the light-emitting device for providing a flash light source according to the first embodiment of the present disclosure.
Figure 3:
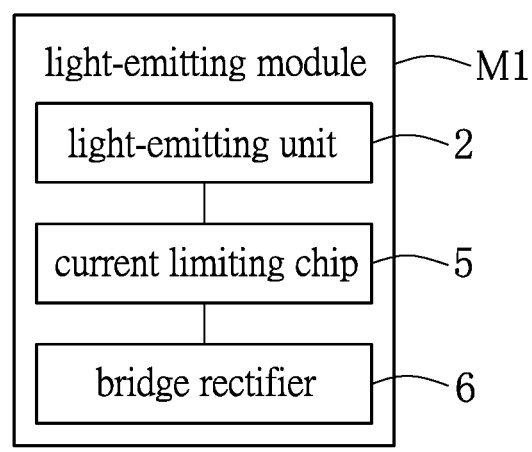
FIG. 3 shows a function block diagram of one of light-emitting modules of the light-emitting device for providing a flash light source according to the first embodiment of the present disclosure.

First of all, referring to FIG. 1 to FIG. 3, the light-emitting module M1 comprises a circuit substrate 1 and a light-emitting unit 2 disposed on the circuit substrate 1 and electrically connected to the circuit substrate 1. The light-emitting unit 2 comprises a plurality of light-emitting elements 20 disposed on the circuit substrate 1 and electrically connected to the circuit substrate 1.

In one example of the first embodiment, as shown in FIG. 2, each of the light-emitting elements 20 comprises a light-emitting diode (LED) chip. Moreover, the light-emitting module M1 further comprises a frame unit 3 and a package unit 4. The frame unit 3 includes a surrounding light-reflecting resin body 30 surroundingly coated on the top surface of the circuit substrate 1. The surrounding light-reflecting resin body 30 surrounds the light-emitting unit 2 to form a resin position limiting space 300 on the circuit substrate 1, and the surrounding light-reflecting resin body 30 has a convex junction portion 3000 (or a concave junction portion) formed on a top surface thereof. Regarding the formation of the convex junction portion 3000 (or a concave junction portion), when the surrounding light-reflecting resin body 30 is formed from a starting location to a finish location (near the end of surrounding coating process), the convex junction portion 3000 (or the concave junction portion) is formed naturally on the surrounding light-reflecting resin body 30. Moreover, the package unit 4 includes a light-transmitting resin body 40 disposed on the top surface of the circuit substrate 1 for enclosing or encapsulating the light-emitting unit 2, and the light-transmitting resin body 40 is disposed inside the resin position limiting space 300 and surrounded by the surrounding light-reflecting resin body 30. As shown in FIG. 3, it is noted that the light-emitting module M1 further comprises a current limiting chip 5 disposed on the circuit substrate 1 and electrically connected to the light-emitting unit 2 and a bridge rectifier 6 disposed on the circuit substrate 1 and electrically connected to the current limiting chip 5. Thus the light-emitting module M1 can be an AC light-emitting module which can electrically connects to a DC power source.

It is noted that phosphors or fluorescent powders which can transform a wave length of the visible light (such as blue light) from the light-emitting elements 20 to a wave length (such as 820 nm) of non-visible light (such as red light) can be added into the light-transmitting resin body 40 so that the non-visible light from the light-emitting elements 20 can only be seen by users who wear night vision goggles.

Figure 4:
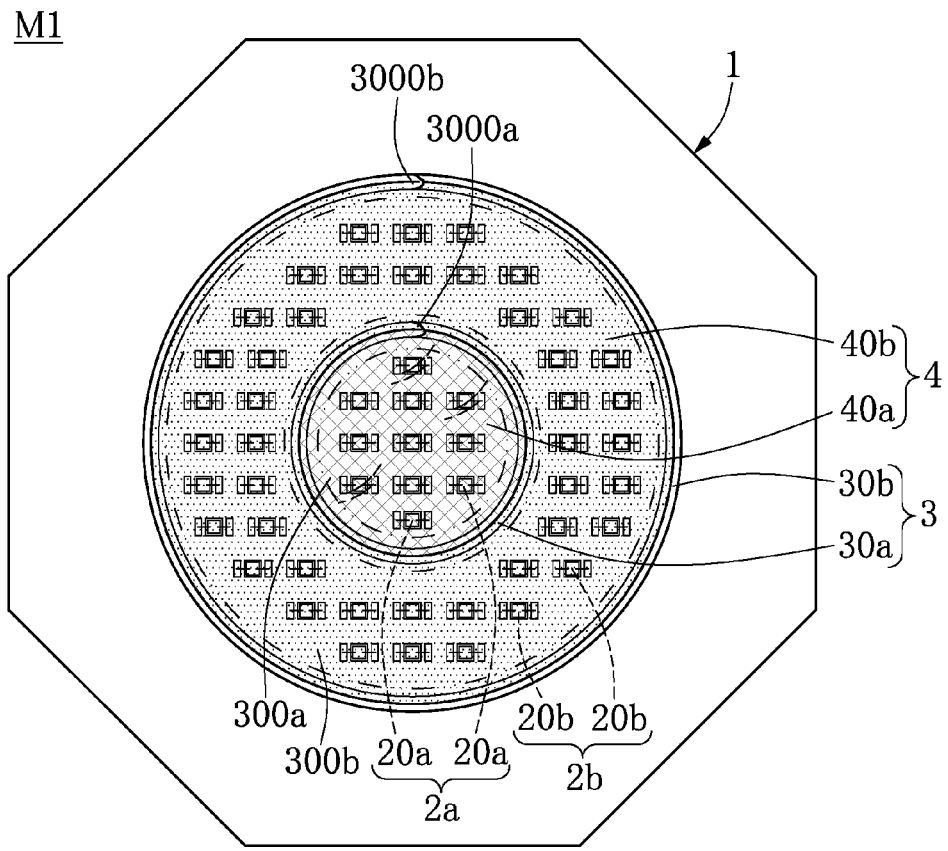
FIG. 4 shows a schematic perspective view of another light-emitting module of the light-emitting device for providing a flash light source according to the first embodiment of the present disclosure.
Figure 5:
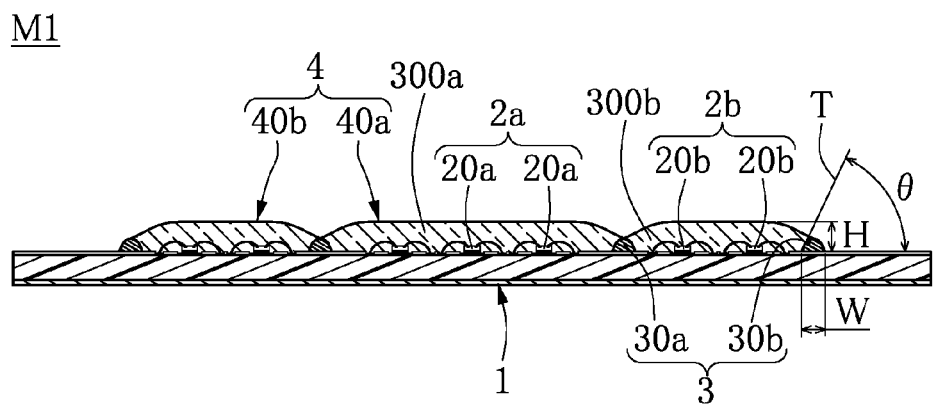
FIG. 5 shows a schematic cross-sectional view of another light-emitting module of the light-emitting device for providing a flash light source according to the first embodiment of the present disclosure.

In another example of the first embodiment, as shown in FIG. 4 and FIG. 5, the plurality of light-emitting elements 20 are divided into a first light-emitting group 2a and a second light-emitting group 2b. In addition, the light-emitting module M1 further includes a frame unit 3 and a package unit 4. The frame unit 3 includes a first surrounding light-reflecting resin body 30a surroundingly coated on the top surface of the circuit substrate 1 and a second surrounding light-reflecting resin body 30b surroundingly coated on the top surface of the circuit substrate 1 for surrounding the first surrounding light-reflecting resin body 30a. The first surrounding light-reflecting resin body 30a surrounds the first light-emitting group 2a to form a first resin position limiting space 300a on the circuit substrate 1. The second surrounding light-reflecting resin body 30b surrounds the second light-emitting group 2b and the first surrounding light-reflecting resin body 30a to form a second resin position limiting space 300b on the circuit substrate 1 and between the first surrounding light-reflecting resin body 30a and the second surrounding light-reflecting resin body 30b. Furthermore, the package unit 4 includes a first light-transmitting resin body 40a and a second light-transmitting resin body 40b disposed on the top surface of the circuit substrate 1 to respectively enclose the first light-emitting group 2a and the second light-emitting group 2b. The first light-transmitting resin body 40a and the second light-transmitting resin body 40b are disposed inside the first resin position limiting space 300a and the second resin position limiting space 300b respectively and surrounded by the first surrounding light-reflecting resin body 30a and the second surrounding light-reflecting resin body 30b respectively.

Following the above description, as shown in FIG. 4, the first light-emitting group 2a includes a plurality of first light-emitting elements 20a disposed on the circuit substrate 1 and electrically connected to the circuit substrate 1, and the second light-emitting group 2b includes a plurality of second light-emitting elements 20b disposed on the circuit substrate 1 and electrically connected to the circuit substrate 1. The first and second light-emitting group 2a and 2b comprise LED chips. In addition, the first surrounding light-reflecting resin body 30a and the second surrounding light-reflecting resin body 30b are arranged in a pattern of concentric circles, the second light-emitting group 2b is disposed between the first surrounding light-reflecting resin body 30a and the second surrounding light-reflecting resin body 30b, and the second light-emitting group 2b surrounds the first surrounding light-reflecting resin body 30a. Furthermore, the first surrounding light-reflecting resin body 30a has a first convex junction portion 3000a (or a first concave junction portion), and the second surrounding light-reflecting resin body 30b has a second convex junction portion 3000b (or a second concave junction portion). In other words, when the first surrounding light-reflecting resin body 30a (or the second surrounding light-reflecting resin body 30b) is formed nearly at the end of surrounding coating process, the first convex junction portion 3000a (or the second concave junction portion 3000b) will be formed naturally.

Following the above description, referring to FIG. 4 and FIG. 5, the method for forming the first surrounding light-reflecting resin body 30a (or the second surrounding light-reflecting resin body 30b) includes the following steps. First of all, liquid colloid (not shown) is surroundingly coated on the top surface of the circuit substrate 1, wherein the liquid colloid can be coated on the circuit substrate 1 to form any shapes (such as a circular shape, a square or a rectangular shape etc.) according to different requirements. The thixotropic index of the liquid colloid may be between 4 and 6, the pressure of coating the liquid colloid on the top surface of the circuit substrate 1 may be between 350 kpa and 450 kpa, and the velocity of coating the liquid colloid on the top surface of the circuit substrate 1 may be between 5 mm/s and 15 mm/s. The liquid colloid is surroundingly coated on the top surface of the circuit substrate 1 from an initial point to a terminal point, and the position of the initial point and the position of the terminal point are substantially the same or overlapped, so that the initial point and the terminal point have a resin structure with a slightly protruding portion (the first convex junction portion 3000a or the second concave junction portion 3000b). Furthermore, the liquid colloid is hardened or cured to form a first surrounding light-reflecting resin body 30a wherein, the liquid colloid is hardened by baking or curing, the baking temperature may be between 120° C. and 140° C., and the baking time may be between 20 minutes and 40 minutes. Therefore, the top surface of the first surrounding light-reflecting resin body 30a (or the second surrounding light-reflecting resin body 30b) has an arc shape, the first surrounding light-reflecting resin body 30a (or the second surrounding light-reflecting resin body 30b) has a radius tangent T and the angle θ of the radius tangent T relative to the top surface of the circuit substrate 1 may be between 40° and 50°, the maximum height H of the first surrounding light-reflecting resin body 30a (or the second surrounding light-reflecting resin body 30b) relative to the top surface of the circuit substrate 1 may be between 0.3 mm and 0.7 mm, the width W of the bottom side of the first surrounding light-reflecting resin body 30a (or the second surrounding light-reflecting resin body 30b) may be between 1.5 mm and 3 mm, the thixotropic index of the first surrounding light-reflecting resin body 30a (or the second surrounding light-reflecting resin body 30b) may be between 4 and 6, and the first surrounding light-reflecting resin body 30a (or the second surrounding light-reflecting resin body 30b) is a white thermo hardening colloid with inorganic additive particles inside.

Furthermore, referring to FIG. 1 and FIG. 2, the light-emitting module M1 comprises a semiconductor switch element M20 which uses a metal-oxide-semiconductor field effect transistor (MOSFET) to turn on/off a power source, and the power module M4 comprises a variable resistor M41 electrically connected to an external power source P and a stabilizer M42 electrically connected between the variable resistor M41 and the control module M2. For example, the external power source P can be typical main electricity power supply for home with a voltage from 100 volts to 240 volts. The control module M2 comprises a micro controller (MCU), and the semiconductor switch element M20 comprises a MOSFET chip with a control program.

Furthermore, referring to FIG. 1 and FIG. 2, the semiconductor switch element M20 electrically connects to the light-emitting elements 20, and the semiconductor switch element M20 can alternately turn on/off a power source so that the light-emitting elements 20 can flash. In other words, the electric power provided by the external power source P can be alternately turned on and provided to the light-emitting elements 20 according to a predetermined frequency so that the light-emitting elements 20 can flash through the alternate turning on of the semiconductor switch element M20. In other words, the light-emitting elements 20 can flash by the control of the semiconductor switch element M20.

Figure 6:
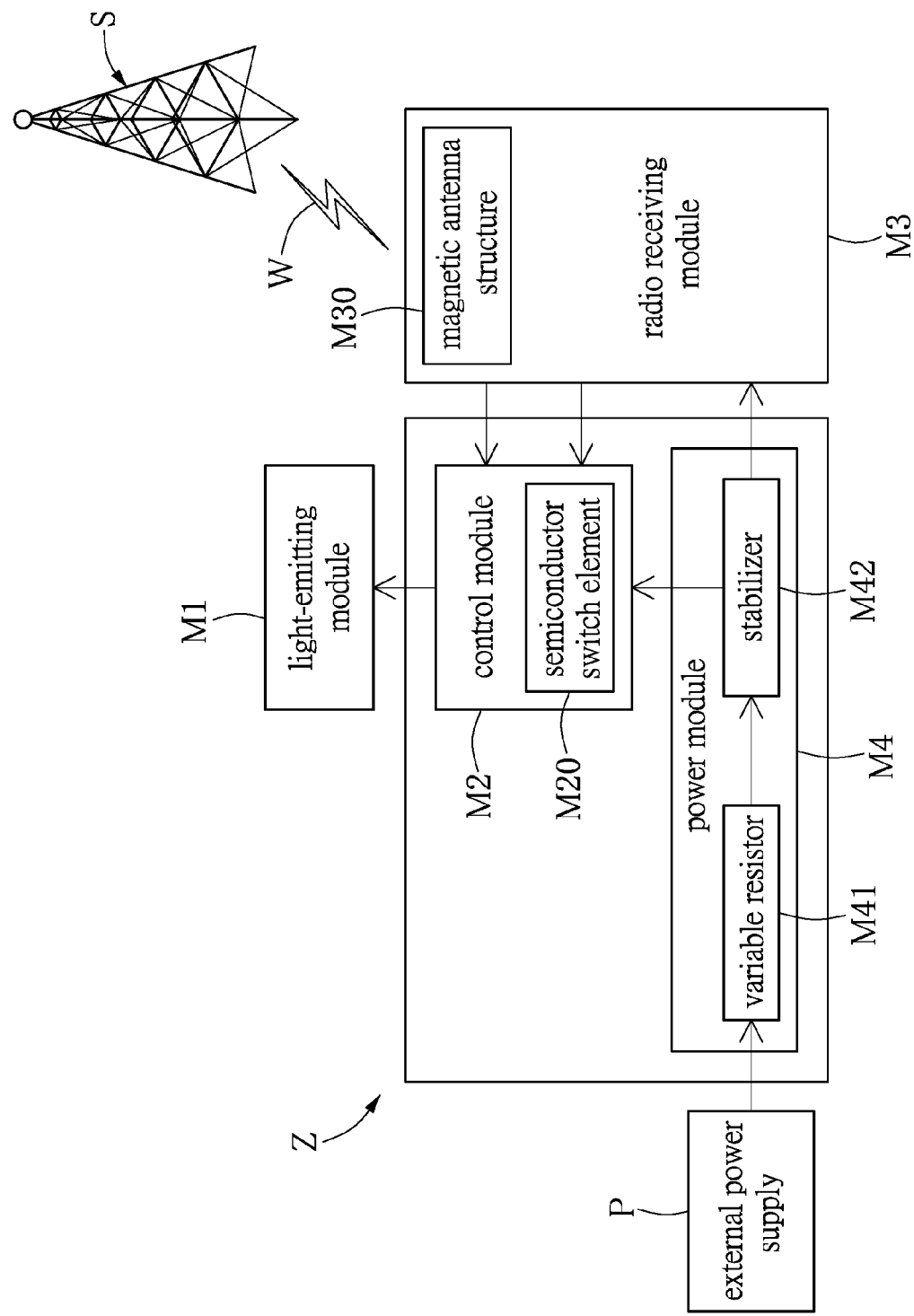
FIG. 6 shows a function block diagram of the light-emitting device for providing a flash light source according to the second embodiment of the present disclosure.
Figure 7:
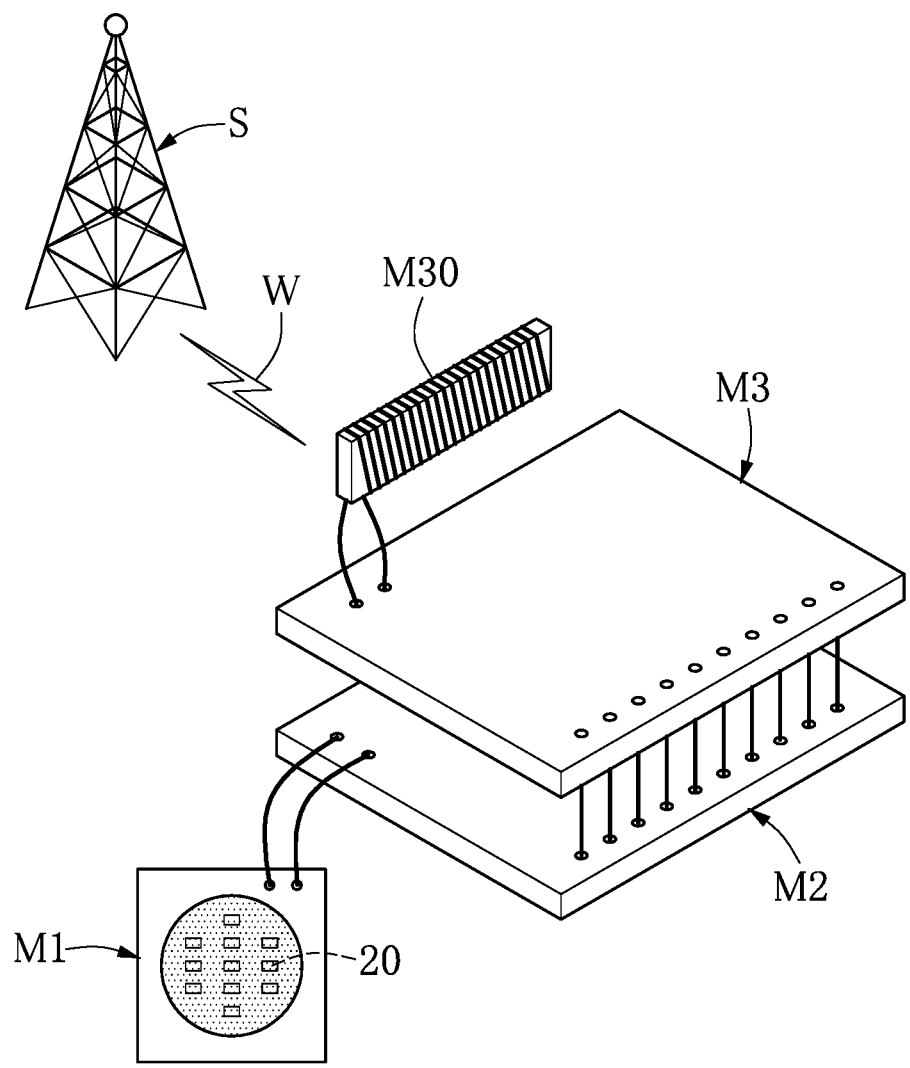
FIG. 7 shows a schematic perspective view of the light-emitting device for providing a flash light source according to the second embodiment of the present disclosure.

Referring to FIG. 6 and FIG. 7, a second embodiment of the present disclosure provides a light-emitting device Z for providing a flash light source, comprising: a light-emitting module M1, a control module M2, a radio receiving module M3 and a power module M4. Comparing FIG. 6 and FIG. 1, the major difference between the second embodiment and the first embodiment is that the light-emitting device Z further comprises a radio receiving module M3, wherein the radio receiving module M3 electrically connects to the control module M2, and the radio receiving module M3 includes a magnetic antenna structure M30.

Moreover, as shown in FIG. 6 and FIG. 7, the radio receiving module M3 can receive a radio wave W from a radio station S, and the radio wave W has a time correction signal. In addition, after the radio receiving module M3 transmits the received time correction signal to the control module M2, the control module M2 can transform the time correction signal to a time synchronization signal. Thus the semiconductor switch element M20 can control the light-emitting elements 20 to synchronously flash according to the time synchronization signal.

It is noted that the power module M4 can electrically connect to the radio receiving module M3 (as shown in FIG. 6) or to the control module M2. Moreover, in order to improve the signal quality of the radio wave W from the radio station S received by the magnetic antenna structure M30 of the radio receiving module M3, the light-emitting device Z of the present disclosure can be configured to be located on the top of a building or a high tower as a aviation obstacle light.

Figure 8:
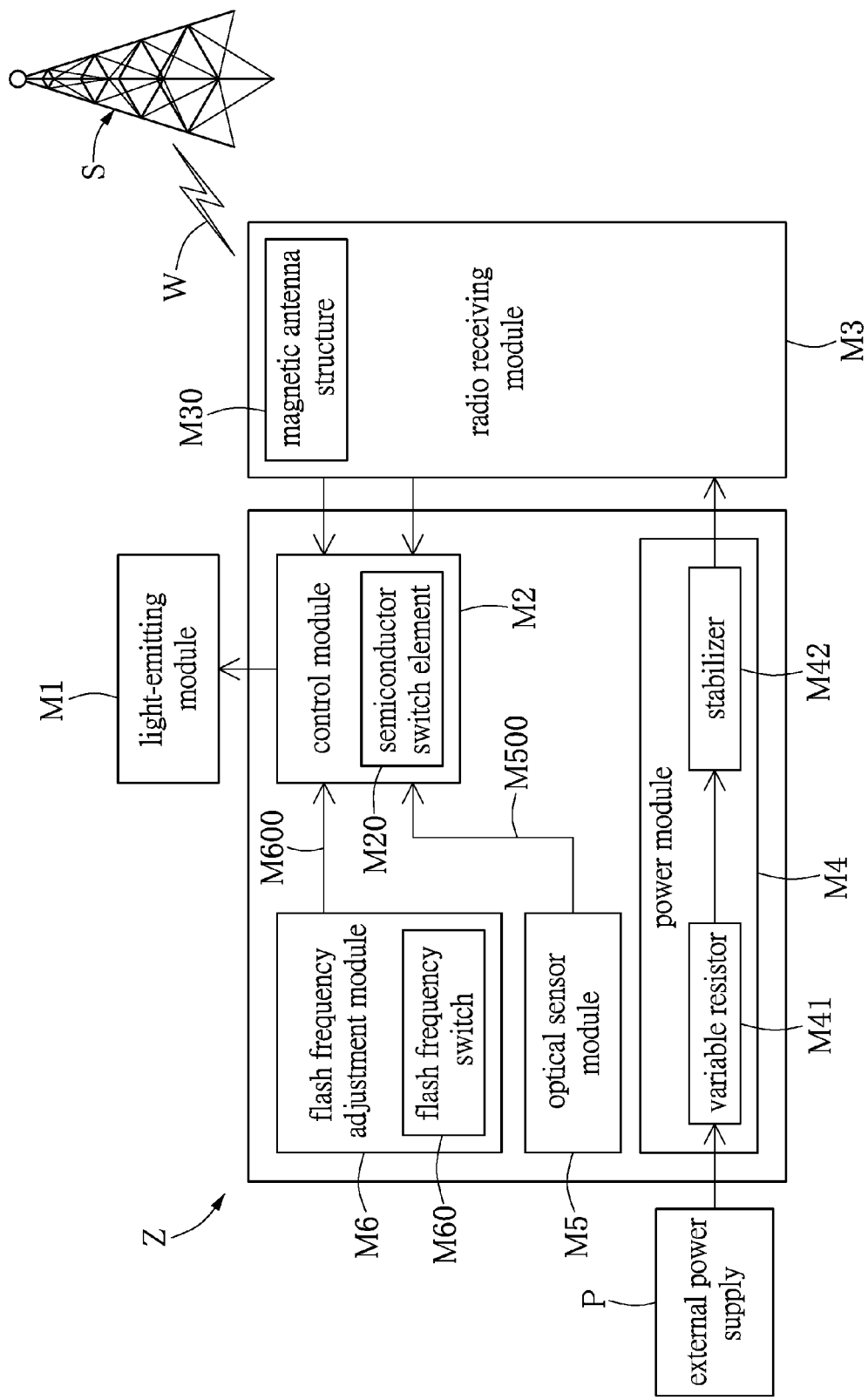
FIG. 8 shows a function block diagram of the light-emitting device for providing a flash light source according to the third embodiment of the present disclosure.

Referring to FIG. 8, a third embodiment of the present disclosure provides a light-emitting device Z for providing a flash light source, comprising: a light-emitting module M1, a control module M2, a radio receiving module M3, a power module M4, an optical sensor module M5 and a flash frequency adjustment module M6. Comparing FIG. 8 and FIG. 6, the major difference between the third embodiment and the second embodiment is that the light-emitting device Z of the third embodiment further comprises an optical sensor module M5 and a flash frequency adjustment module M6.

First of all, as shown in FIG. 7 and FIG. 8, the optical sensor module M5 electrically connects to the control module M2, and the optical sensor module M5 can receive light from an external light source. Furthermore, the optical sensor module M5 can provide a light intensity signal M500 to the control module M2 according to a light intensity provided by the external light source, and the semiconductor switch element M20 of the control module M2 can turn on the light-emitting elements 20 so that the light-emitting elements 20 can continuously flash or turn off the light-emitting elements 20 so that the light-emitting elements 20 can stop flashing according to the light intensity signal M500. For example, the optical sensor module M5 can be a photoresistor or any other kind of photo detector. When the light-emitting device Z is used during daytime, since the light intensity of the external light source received by the optical sensor module M5 is stronger, the semiconductor switch element M20 can turn off the light-emitting elements 20 so that the light-emitting elements 20 can stop flashing according to the light intensity signal M500. When the light-emitting device Z is used at night, since the light intensity of the external light source received by the optical sensor module M5 is weaker, the semiconductor switch element M20 can turn on the light-emitting elements 20 so that the light-emitting elements 20 can continuously flash according to the light intensity signal M500. In other words, the light-emitting elements 20 can be turned on to continuously flash or be turned off to stop flashing through the control of the semiconductor switch element M20 according to the light intensity signal M500 from the optical sensor module M5.

Moreover, as shown in FIG. 7 and FIG. 8, the flash frequency adjustment module M6 electrically connects to the control module M2, and the flash frequency adjustment module M6 includes a flash frequency switch M60. Furthermore, the flash frequency adjustment module M6 can provide a predetermined flash frequency signal M600 to the control module M2 according to a predetermined flash frequency provided by the flash frequency switch M60, and the semiconductor switch element M20 of the control module M2 can control the light-emitting elements 20 to flash at the predetermined flash frequency according to the flash frequency signal M600. In other words, the light-emitting elements 20 can flash at a predetermined flash frequency through the control of the semiconductor switch element M20 according to the flash frequency signal M600 from the flash frequency adjustment module M6.

One of beneficial features of the present disclosure is that the light-emitting device Z for providing a flash light source of the present disclosure can control a plurality of light-emitting elements 20 to flash through multiple features including a control module M2 comprising a semiconductor switch element M20 which uses a metal-oxide-semiconductor field effect transistor (MOSFET) to turn on/off a power source, and the semiconductor switch element M20 which electrically connects to the light-emitting elements 20 alternately turning on/off a power source.

Moreover, the light-emitting device Z for providing a flash light source of the present disclosure has multiple features including a radio receiving module M3 receiving a radio wave W with a time correction signal from a radio station S via a magnetic antenna structure M30, and a control module M2 transforming the time correction signal to a time synchronization signal so that the semiconductor switch element M20 can control a plurality of light-emitting elements 20 to flash according to the time synchronization signal.

Furthermore, the light-emitting device Z for providing a flash light source of the present disclosure has multiple features including an optical sensor module M5 electrically connecting to a control module M2 and the optical sensor module M5 receiving light from an external light source, and the optical sensor module M5 providing a light intensity signal M500 to the control module M2 according to a light intensity provided by the external light source so that the semiconductor switch element M20 can turn on and control light-emitting elements 20 to continuously flash or turn off and control the light-emitting elements 20 to stop flashing according to the light intensity signal M500.

Moreover, the light-emitting device Z for providing a flash light source of the present disclosure has multiple features including a flash frequency adjustment module M6 electrically connects to a control module M2 and the flash frequency adjustment module M6 including a flash frequency switch M60, and the flash frequency adjustment module M6 providing a predetermined flash frequency signal M600 to the control module M2 according to a predetermined flash frequency provided by the flash frequency switch M60, so that the semiconductor switch element M20 can control light-emitting elements 20 to flash at the predetermined flash frequency according to the flash frequency signal M600.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A light-emitting device for providing a flash light source, comprising:
   a light-emitting module including a circuit substrate and a plurality of light-emitting elements disposed on the circuit substrate and electrically connected to the circuit substrate;
   a control module including a semiconductor switch element having a MOSFET for turning the light-emitting module on or off, wherein the semiconductor switch element is electrically connected to the light-emitting elements, and each light-emitting element is alternately turned on and off by the semiconductor switch element so as to generate the flash light source; and
   a radio receiving module electrically connected to the control module, wherein the radio receiving module includes a magnetic antenna structure, a radio wave generated by a radio station is received by the magnetic antenna structure of the radio receiving module, and the radio wave has a time correction signal;
   wherein the time correction signal received by the radio receiving module is transmitted to the control module, the time correction signal is transformed into a time synchronization signal through the control module, and the light-emitting elements are synchronously flashed by the semiconductor switch element of the control module according to the time synchronization signal.

2. The light-emitting device of claim 1, further comprising:
- a power module including a variable resistor electrically connected to an external power supply, and a stabilizer electrically connected between the variable resistor and the radio receiving module;
- an optical sensor module electrically connected to the control module for receiving an external light source, wherein the optical sensor module provides a light intensity signal to the control module according to a light intensity provided by the external light source, and the light-emitting elements are turned on to continuously flash or turned off to stop flashing by the semiconductor switch element of the control module according to the light intensity signal; and
- a flash frequency adjustment module electrically connected to the control module, wherein the flash frequency adjustment module includes a flash frequency switch, the flash frequency adjustment module provides a flash frequency signal to the control module according to a predetermined flash frequency provided by the flash frequency switch, and the light-emitting elements are flashed at the predetermined flash frequency by the semiconductor switch element of the control module according to the flash frequency signal.

3. The light-emitting device of claim 1, wherein the light-emitting module includes:
- a frame unit having a surrounding light-reflecting resin body surroundingly coated on the circuit substrate, wherein the surrounding light-reflecting resin body surrounds the light-emitting elements to form a limiting space on the circuit substrate, and the surrounding light-reflecting resin body has a convex junction portion; and
- a package unit having a light-transmitting resin body disposed on the circuit substrate for enclosing the light-emitting elements, wherein the light-transmitting resin body is disposed inside the limiting space and surrounded by the surrounding light-reflecting resin body.

4. The light-emitting device of claim 1, wherein the light-emitting elements are divided into a first light-emitting group and a second light-emitting group, and the light-emitting module includes:
- a frame unit having a first surrounding light-reflecting resin body surroundingly coated on the circuit substrate and a second surrounding light-reflecting resin body surroundingly coated on the circuit substrate for surrounding the first surrounding light-reflecting resin body, wherein the first surrounding light-reflecting resin body surrounds the first light-emitting group to form a first limiting space, the second surrounding light-reflecting resin body surrounds the second light-emitting group and the first surrounding light-reflecting resin body to form a second limiting space between the first surrounding light-reflecting resin body and the second surrounding light-reflecting resin body, the first surrounding light-reflecting resin body has a first convex junction portion and the second surrounding light-reflecting resin body has a second convex junction portion; and
- a package unit having a first light-transmitting resin body enclosing the first light-emitting group on the circuit substrate and a second light-transmitting resin body enclosing the first light-emitting group on the circuit substrate, wherein the first light-transmitting resin body and the second light-transmitting resin body are surrounded by the first surrounding light-reflecting resin body and the second surrounding light-reflecting resin body respectively and disposed inside the first limiting space and the second limiting space respectively.

5. A light-emitting device for providing a flash light source, comprising:
- a light-emitting module including a circuit substrate and a plurality of light-emitting elements disposed on the circuit substrate and electrically connected to the circuit substrate;
- a control module including a semiconductor switch element having a MOSFET for turning the light-emitting module on or off, wherein the semiconductor switch element is electrically connected to the light-emitting elements, and each light-emitting element is alternately turned on and off by the semiconductor switch element so as to generate the flash light source; and
- an optical sensor module electrically connected to the control module for receiving an external light source, wherein the optical sensor module provides a light intensity signal to the control module according to a light intensity provided by the external light source, and the light-emitting elements are turned on to continuously flash or turned off to stop flashing by the semiconductor switch element of the control module according to the light intensity signal.

6. The light-emitting device of claim 5, further comprising: a flash frequency adjustment module electrically connected to the control module, wherein the flash frequency adjustment module includes a flash frequency switch, the flash frequency adjustment module provides a flash frequency signal to the control module according to a predetermined flash frequency provided by the flash frequency switch, and the light-emitting elements are flashed at the predetermined flash frequency by the semiconductor switch element of the control module according to the flash frequency signal.

7. The light-emitting device of claim 5, further comprising: a radio receiving module electrically connected to the control module, wherein the radio receiving module includes a magnetic antenna structure, a radio wave generated by a radio station is received by the magnetic antenna structure of the radio receiving module, and the radio wave has a time correction signal, and wherein the time correction signal received by the radio receiving module is transmitted to the control module, the time correction signal is transformed into a time synchronization signal through the control module, and the light-emitting elements are synchronously flashed by the semiconductor switch element of the control module according to the time synchronization signal.

8. The light-emitting device of claim 5, wherein the light-emitting module includes:
- a frame unit having a surrounding light-reflecting resin body surroundingly coated on the circuit substrate, wherein the surrounding light-reflecting resin body surrounds the light-emitting elements to form a limiting space on the circuit substrate, and the surrounding light-reflecting resin body has a convex junction portion; and
- a package unit comprising a light-transmitting resin body disposed on the circuit substrate for enclosing the light-emitting elements, wherein the light-transmitting resin body is disposed inside the limiting space and surrounded by the surrounding light-reflecting resin body.

9. The light-emitting device of claim 5, wherein the light-emitting elements are divided into a first light-emitting group and a second light-emitting group, and the light-emitting module includes:
- a frame unit having a first surrounding light-reflecting resin body surroundingly coated on the circuit substrate and a second surrounding light-reflecting resin body surroundingly coated on the circuit substrate for surrounding the first surrounding light-reflecting resin body, wherein the first surrounding light-reflecting resin body surrounds the first light-emitting group to form a first limiting space, the second surrounding light-reflecting resin body surrounds the second light-emitting group and the first surrounding light-reflecting resin body to form a second resin position limiting space between the first surrounding light-reflecting resin body and the second surrounding light-reflecting resin body, the first surrounding light-reflecting resin body has a first convex junction portion and the second surrounding light-reflecting resin body has a second convex junction portion; and
- a package unit having a first light-transmitting resin body enclosing the first light-emitting group on the circuit substrate and a second light-transmitting resin body enclosing the first light-emitting group on the circuit substrate, wherein the first light-transmitting resin body and the second light-transmitting resin body are surrounded by the first surrounding light-reflecting resin body and the second surrounding light-reflecting resin body respectively and disposed inside the first resin position limiting space and the second resin position limiting space respectively.

\* \* \* \* \*